United States Patent [19]

Hamberg et al.

[11] Patent Number: 4,804,906

[45] Date of Patent: Feb. 14, 1989

[54] METHOD AND APPARATUS FOR WELL CASING INSPECTION

[75] Inventors: Allan Hamberg, Fullerton; Elmer L. Thomas, Orange; Henry T. Carruth, Jr., Anaheim; Mitchell F. Peterson, Diamond Bar, all of Calif.

[73] Assignee: Chevron Research Company, San Francisco, Calif.

[21] Appl. No.: 11,097

[22] Filed: Feb. 5, 1987

[51] Int. Cl.$^4$ ............................................. G01R 27/02
[52] U.S. Cl. ................................. 324/65 R; 324/366; 324/62
[58] Field of Search ................ 324/62, 64, 65 R, 366, 324/367, 368, 357; 363/60; 323/266

[56] References Cited

U.S. PATENT DOCUMENTS

| | | | |
|---|---|---|---|
| 2,103,636 | 3/1935 | Pearson | 175/183 |
| 2,459,196 | 1/1949 | Stewart | 175/182 |
| 2,896,159 | 7/1955 | Webster | 324/64 |
| 3,207,981 | 9/1965 | Marsh et al. | 324/65 |
| 3,849,722 | 11/1974 | Nilsson | 324/357 |
| 3,995,213 | 11/1976 | Robinson et al. | 324/64 |
| 4,149,232 | 4/1979 | Eaton, Jr. | 363/60 |
| 4,431,963 | 2/1984 | Walkow | 324/65 R |
| 4,431,964 | 2/1984 | Walkow | 324/65 R |

Primary Examiner—Reinhard J. Eisenzopf
Assistant Examiner—Robert W. Mueller
Attorney, Agent, or Firm—S. R. LaPaglia; Edward J. Keeling

[57] ABSTRACT

An oil and gas well casing inspection tool is disclosed. The casing inspection tool comprises a body; inner and outer contact rollers extending from the body; means for generating a current between the outer contacts; and means for measuring a potential difference between the inner contacts. To enhance the accuracy of the device, capacitance is used downhole to increase the amount of current that can be supplied to the casing. Leaf springs engage the contact rollers to maintain a clean connection between the body and the casing. Signal coders and decoders are also disclosed.

29 Claims, 9 Drawing Sheets

FIG. 6

METHOD AND APPARATUS FOR WELL CASING INSPECTION

FIELD OF THE INVENTION

The present invention relates to the field of tubular pipe inspection. More specifically, the present invention provides a method and apparatus for inspecting oil and gas well casing.

BACKGROUND OF THE INVENTION

Subterranean wells such as those used for the production of oil and gas commonly use tubular products called "casing" to line the interior walls of the well. The casing in most wells is formed of metallic materials and, most commonly, steel. The casing is in contact directly or indirectly with the surrounding earth. As a consequence, the casing is subjected to the possibility of the passage of electrical currents away from it and, therefore, corrosion.

It is possible to protect the well casing by imposing an artificial current of equal or greater magnitude and in the opposite direction to the natural current leaving the casing. To do so properly and economically, it is necessary to accurately determine the magnitude of the current picked up by the well casing. This can be accomplished by measuring the voltage (IR drop) at various locations in the well and dividing this value by the resistance of the casing at that location. Estimates of the resistance of the casing can be obtained from the casing manufacturer. However, gross inaccuracies can arise from use of these data. Errors can arise because manufacturing variations in the casing wall thickness can range up to ±12%. Further errors can arise because the casing has become corroded, or because of material variations within the casing.

Various devices have been described which are intended to measure casing resistance. For example, U.S. Pat. No. 4,431,963 (Walkow, which is incorporated herein by reference for all purposes) describes such a device. Four contacts (C1, C2, C3, and C4) are raised and lowered in a wellbore. The natural casing potential between the innermost contacts (C2 and C3) is determined at various locations in the wellbore. A known current is then passed between the outer contacts (C1 and C4) while the potential drop between the innermost contacts (C2 and C3) is measured. From these values, the casing resistance at any point in the casing, the natural current flow from the casing and, ultimately, the metal loss rate in the casing can be determined. Variations in this method are also described using AC, and pulsed current flows.

There are several inherent disadvantages of the above system (and those of a similar nature). Initially, it has been found by the present inventors that the rollers used as contacts (C1, C2, C3, and C4) in Walkow can become fouled with paraffin, pipe dope, corrosion materials, and the like. Therefore, inadequate contact between the tool and the casing wall is made. This can result in inaccurate casing resistance values. Further, it has been found that the low current imposed on the casing (for the purpose of determining resistance) can result in significant errors because the "noise" in the measured values is almost as large as the values themselves. The device described by Walkow cannot impose large currents on the casing because it is limited by the capabilities of a typical logging cable to transmit such current from the surface. Further errors can arise due to inadequacies in the method and apparatus used to transmit data to the surface.

It is desirable, therefore, to devise a tool which maintains acceptable contact with the well casing and which can impose significant current on the casing for the purpose of determining casing resistance. It is further desirable to devise a method and apparatus which can transmit data to the surface without data loss or distortion.

SUMMARY OF THE INVENTION

The present invention provides a method and apparatus for casing inspection which provides highly accurate casing resistance values and casing potential values. The tool comprises one or more radially positioned contacts located at two or more vertical locations in the casing or pipe. In the preferred embodiment, the contact points are pipe cutter rollers. The natural potential difference between the contact points is measured. A current is then impressed on the casing between the contact points and the potential is again measured between the contacts. When the current passing through the casing and the potential difference between the contacts are known, the casing resistance and, therefore, the natural casing current between the inner contacts can be calculated. By performing the operation at a plurality of locations in the well, a casing profile can also be developed, giving not only a profile of current distribution but also a profile of metal loss in the well.

To enhance the accuracy of the device over that of the prior art devices, it is necessary to impose a current greater than that which can be provided through a well logging cable. Therefore, the present invention also provides an energy storage device in the tool which can store energy via the well logging cable from the surface and create high pulses (e.g., a capacitor). In the preferred embodiment, a bipolar current pulse from a current regulated driver applies a constant current over the pulse duration.

Further, to positively engage the contacts with the casing, backup plates are added to pipe cutter rollers. These backup plates maintain the pipe cutter rollers in a clean condition so that good electrical contact is made with the casing. This backup reduces costs because it may be unnecessary to acidize, scrape, and/or fill a well with oil before a casing profile is run.

In summary, an oil and gas well casing inspection tool is disclosed. The casing inspection tool comprises a central body adapted to be inserted in a tubular metallic member; first and second contacts extending from the body and adapted to contact the member; means for generating a current between the contacts; and means for measuring a potential difference between the contacts. To enhance the accuracy of the device, capacitance means are used in the tool to increase the amount of current that can be supplied to the casing between the contacts. Leaf springs engage the contact rollers to maintain a clean connection between the body and the casing. Signal coding and decoding means are also disclosed for transmission of the data to the surface.

DETAILED DESCRIPTION OF THE INVENTION

Figures 1, 2A:
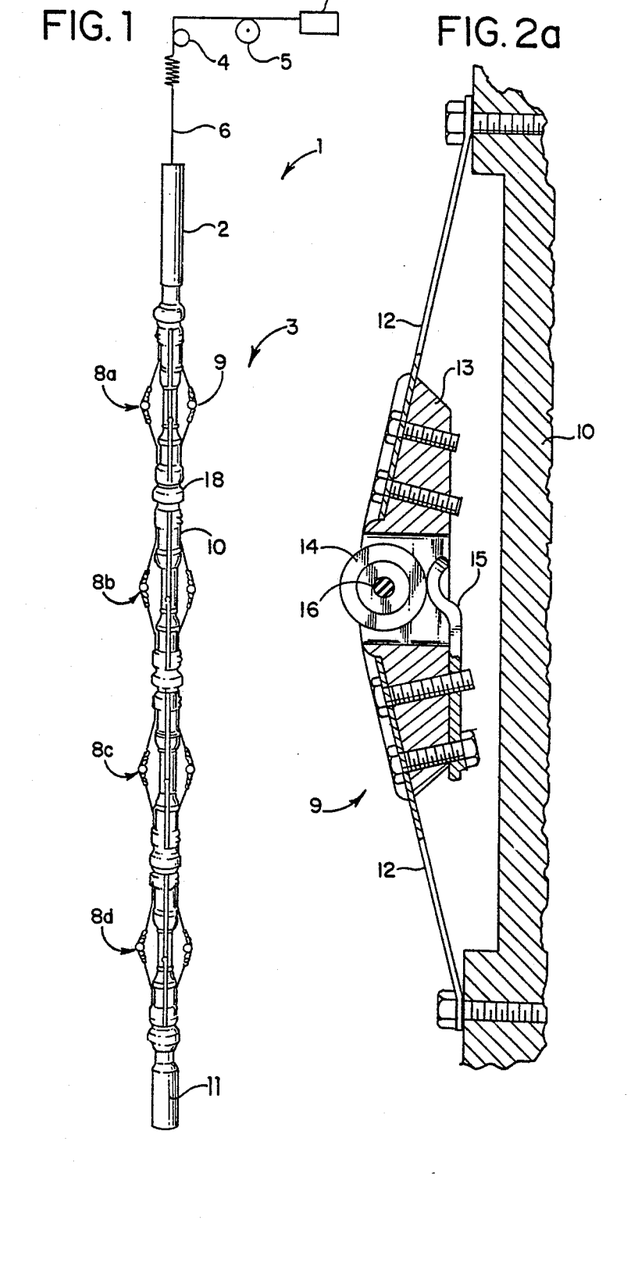
FIG. 1 shows the general mechanical configuration of the tool in side view.
FIGS. 2a and 2b are detailed drawings in side and front views of the improved roller assembly partially in cross section.

FIG. 1 shows the tool 1 in side view. The tool comprises an electronics package 2 generally mounted on the top of the contact section 3. The tool is suspended in a cased wellbore (not shown) by an armored electrical or electrical/optical multiconductor logging cable 6 which extends to the surface of the earth. Depth measuring equipment 4, such as an odometer, is used to record the location of the tool as it is raised and lowered in the wellbore with lifting equipment 5. A casing collar locator (not shown) may also be used to determine the location of the tool in the well. As data are transmitted up the logging cable, they are recorded in surface monitoring equipment 7.

The contact portion of the tool includes contacts 8a and 8d (the outside contacts), 8b and 8c (the inside contacts). The spacing between the inner contacts is approximately 10 feet and the spacing between the outer contacts is approximately 15 feet in the preferred embodiment. In the preferred embodiment, each contact includes four evenly, radially mounted roller assemblies 9. While four rollers are shown, it is possible to effectively utilize the present invention by using a different number of radially mounted rollers or a different vertical configuration of contacts. The contacts are mounted on a central body 10 which provides support for the contacts and protects the necessary wiring which is contained therein. Central body 10 is made of a nonmagnetic material. In the preferred embodiment, central body 10 is aluminum.

A weight 11 can optionally be provided. The weight serves to keep the cable 6 taut as the tool is lowered in the wellbore. Insulating junctions 18 must also be utilized.

Figure 2B:
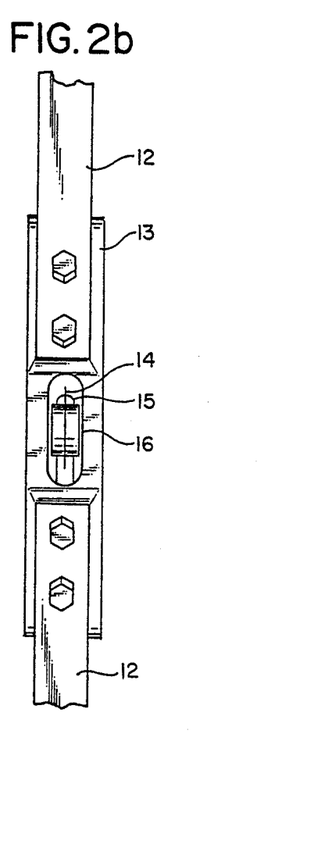
Figure 3A:
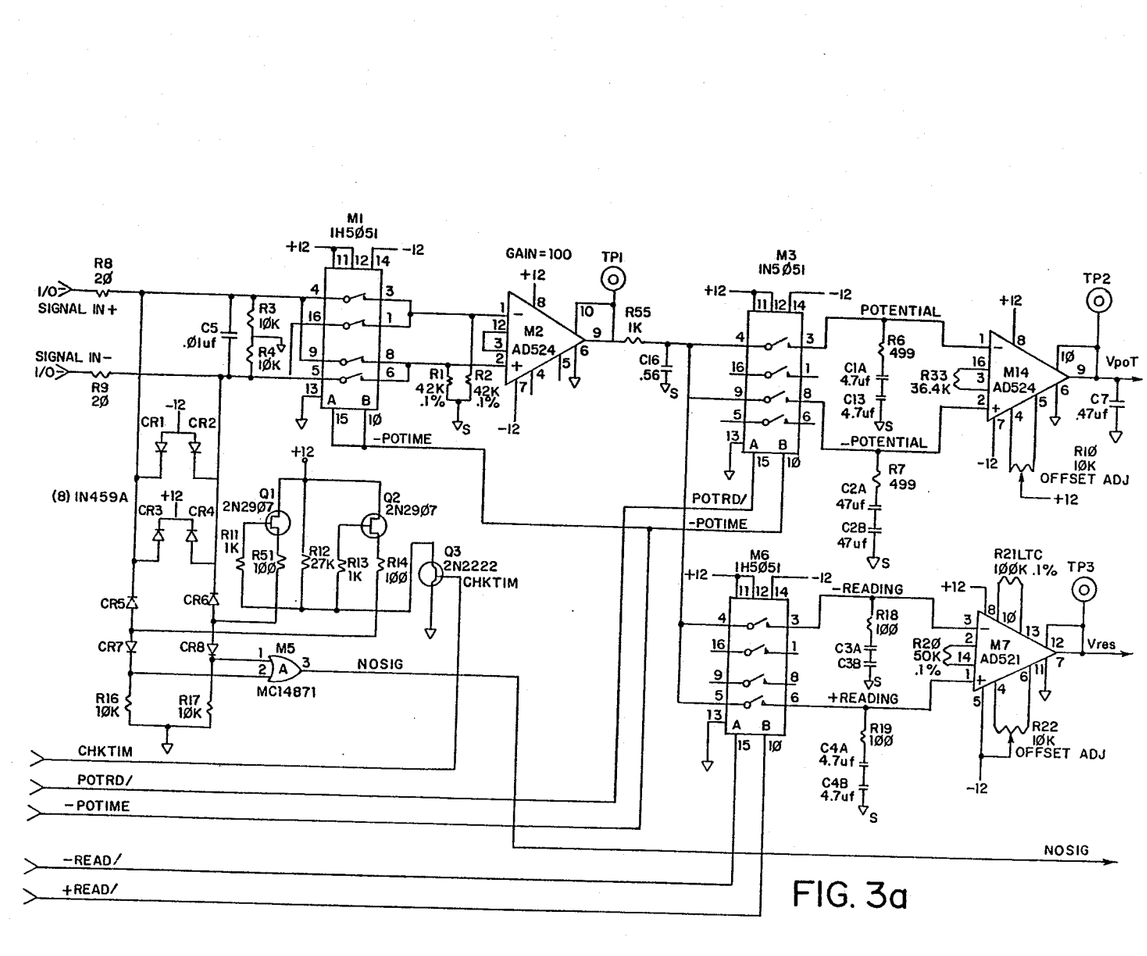
FIGS. 3a, 3b, 3c, and 3d show the general electrical configuration of the tool.
Figure 3B:
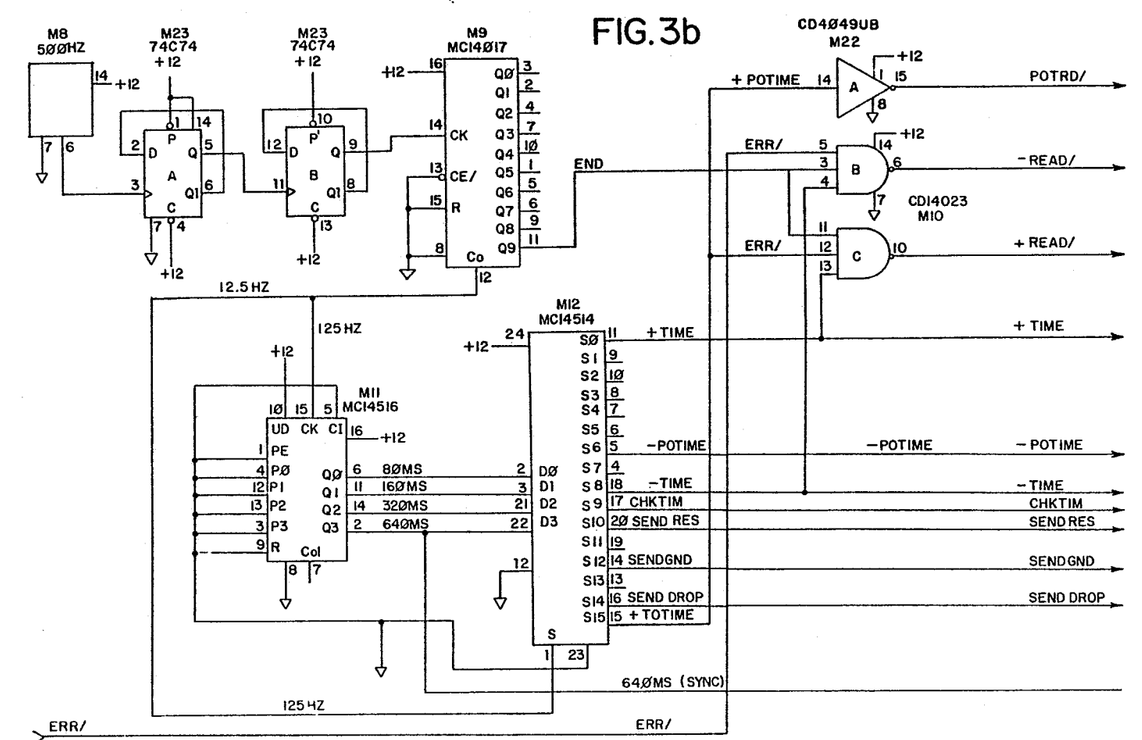
Figure 3C:
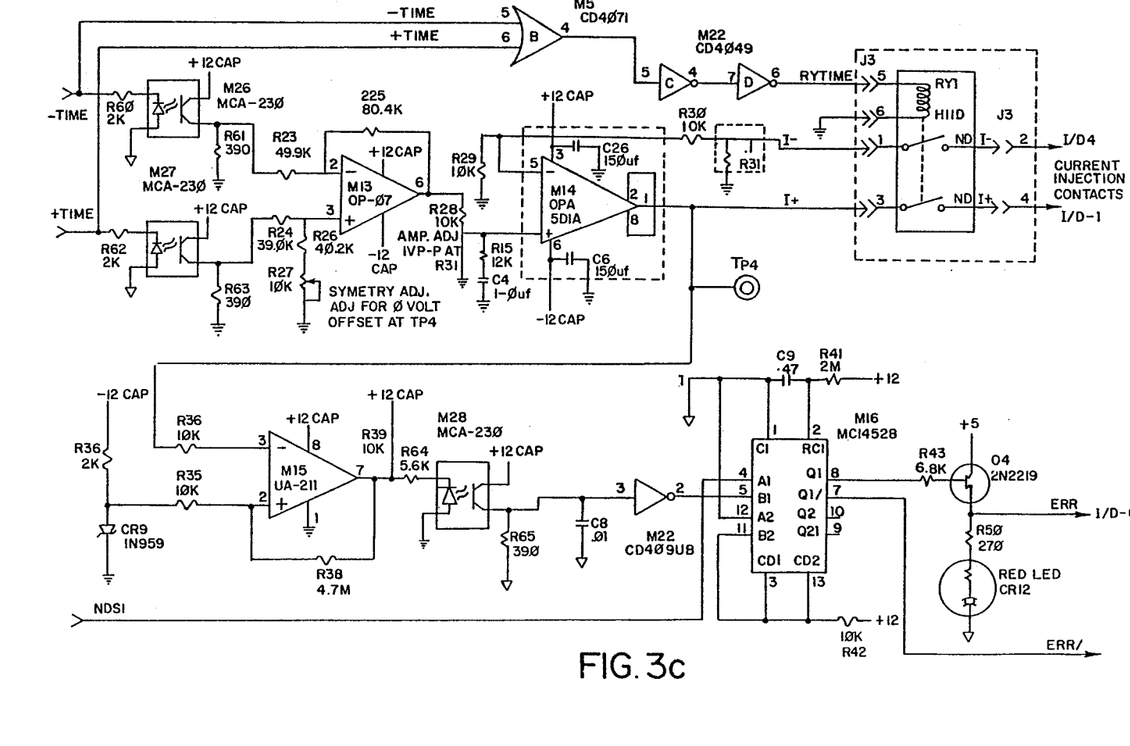
Figure 3D:
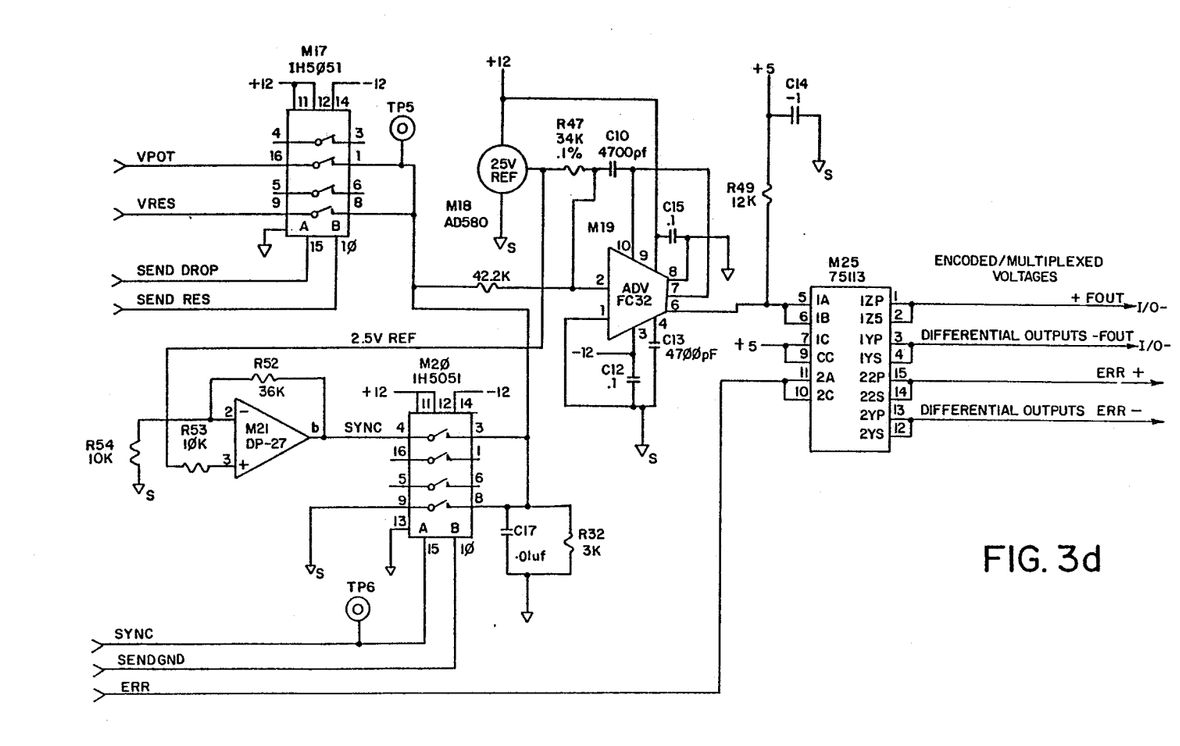

FIGS. 2a and 2b show the roller assembly in detailed side and front views. The roller assembly includes an upper and a lower leaf spring 12 mounted to central body 10 and roller body 13. Roller 14 is rotatably mounted with a roller shaft 16 in and extends out of body 13. In the preferred embodiment, roller 14 is a pipe cutter roller. A cleaning spring 15 is mounted to the roller body and bears against the roller 14. With this configuration, the contact path is from the casing to the roller to the cleaning spring to measuring contacts on an insulated portion of the body 10. This bypasses the roller shaft 16 (which develops high resistance when run in a dirty casing in the prior art tools). It also avoids the need for the well to be scraped and acidized prior to performing a casing survey.

In general, the casing resistance tool is designed to make a four-point resistance check of a section of a downhole well casing. It also makes a potential difference measurement on the same section. The measurements are corrected for amplifier offset and converted into a pulse train whose frequency is proportional to the voltage and transmitted differentially up the hole. This pulse train is converted back to an analog signal, demultiplexed and displayed on a tool panel contained within the surface monitoring equipment and made available to a computer system.

Figure 4:
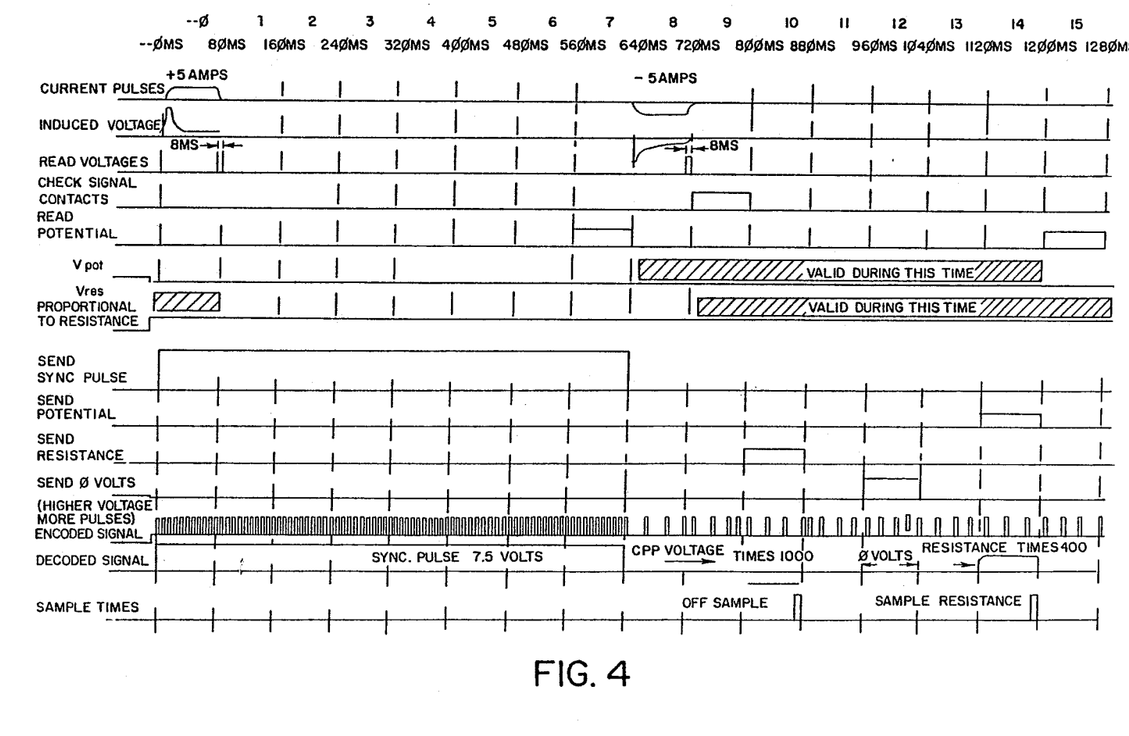
FIG. 4 shows a timing diagram for the preferred embodiment.

The casing resistance tool is controlled by the timing circuits in FIGS. 3a, 3b, 3c, and 3d. The timing diagram in FIG. 4 illustrates the sequence of events. The timing cycle is easily thought of in the sixteen parts labeled "0-15" in the timing diagram.

At time 0, the signal RYTIME closes relay RY1 to allow the current-generating circuitry to be attached to the outer contacts. This switching-in of the current injection contacts allows potential readings to be made free from the effect of ground loops in the measurement circuitry. A +5-amp, 80-millisecond pulse is generated across the two outer contacts (8a and 8d) of the tool. The inner two contacts (8b and 8c) are attached to the input leads of amplifier M2 through switch M1, and measure the voltage drop across the section of the pipe between the inner contacts. The physical configuration of the contacts create a one-turn transformer with the primary leads being the loop shown in the figure between the outer contacts. The inner contacts 8b and 8c are the secondary turn in this transformer. The magnetic field formed due to the current flow between contacts 8a and 8d is captured by the well casing. Forming the central body 10 out nonmagnetic materials prevents some of the magnetic field from being coupled into the signal leads. This field then is impressed on the signal leads and presents a spike and a false indication of voltage to be measured. The false voltage takes almost the full 80 milliseconds to decay to a steady state value, at which time the voltage is measured.

The timing diagram (FIG. 4) shows that the leading and trailing edges of the pulse are rounded. This softening of the edges of the current pulses counteracts rapid buildup in the magnetic field while the current is reaching 5 amps.

The voltage across the inner contacts is amplified by amplifier M2 but is not sampled until the last 8 milliseconds of period 0. This sampling is done by switch M6B when it gets the 8-millisecond pulse, +READ/. The amplified voltage is then stored and held by capacitors C4A and C4B. This voltage is subtracted from the voltage held by capacitors C3A and C3B, which is the voltage drop when a negative 5-amp signal (discussed below) is applied to the pipe, and is called VRES.

The next six periods (1-6) allow any charge, current, or magnetic effects to decay on the pipe. In period 7, the amplified voltage across the inner contacts is sampled by POTRD/ and "stored" in capacitors C1A and C1B. This voltage is subtracted from the voltage "stored" in capacitors C2A and C2B (which is the current flowing on the casing not induced by the tool). This difference is amplified by a factor of 2 and is called VPOT.

In period 8, the signal RYTIME closes relay RY1 to allow the signal-generating circuitry to be attached to the current injection contacts. A negative 5 amps flows between the outer contacts and a voltage is measured across the inner contacts. This current pulse is "rounded" like the positive pulse in period 0 for the same reasons. The signal −READ/, an 8-millisecond pulse, closes switch M6A to store the amplified voltage in capacitors C3A and C3B. This voltage and the voltage stored in capacitors C4A and C4B are subtracted and amplified by amplifier M7 and called VRES. From this time to time 0 when a new voltage is stored in C4A and C4B, VRES is a representation of the resistance of the section of pipe between the inner contacts. This positive pulsing then negative pulsing cancels out the effects of any current flow along the pipe such as caused by a cathodic protection system, and subtracts out any internal amplifier offsets.

In period 15, after all effects from the negative current pulse and the signal contact integrity check (discussed further below), the direction of the leads at switch M1 are switched. The voltage measured during this time is sampled by the pulse −POTIME through switch M3B and stored on capacitors C2A and C2B. This voltage is added to the voltage stored in capacitors C1A and C1B. This swapping of input signals cancels any errors due to offset voltage in amplifier M2.

The connection of the inner contacts to the pipe are checked in time period 9. During this time period, a pulse from a transistor Q3 is sent to transistors Q1 and Q2 through the diodes CR5-6 to the inner contacts. If both inner contacts are good, there is a short to ground and no pulses are transmitted through either CR7 or CR8 to the logic gate M5. If either contact is not contacting the pipe, the pulse that came from either Q1 or Q2 will be sent to logic gate M5 and then passed on to the one-shot (pulse generator) M16. This will cause a one-second error pulse ERR/ to disable the pulses −READ/ and +READ/. This pulse is transmitted differentially up the hole by driver M25 to the panel to alert the operator that the contacts are not making a good contact.

The outer contact integrity is tested in a slightly different way. The pulse generation circuit is a constant-current type supply. If the outer contacts are making good contact, the voltage across the two contacts, as measured at TP4, will be very small. If the contacts are across a higher than normal resistance, the supply will try to provide the requested current. Ohm's Law says that voltage is proportional to resistance. Therefore, if the current is fixed the voltage in time period 4 will rise with contact resistance. If the voltage at TP4 exceeds the 7.5-volt reference at M15 pin 2, then a pulse is generated by one-shot M16. This one-second pulse also disables the +READ/ and −READ/ pulses and is transmitted up the hole to the operator.

During periods 0-7, switch M20A is closed and allows the voltage from M21 (7.5 volts DC) to be converted by a frequency to voltage converter M19. This converter generates a pulse train that is proportional to the voltage at TP5. The converter is biased in such a way that a voltage of −3 volts or lower will give a frequency of 0 hertz, and a voltage of 7.5 volts or greater will generate a frequency of 20 kilohertz. Any voltage between these two values gives a proportional frequency.

During time period 10, switch M17A is closed putting voltage VPOT on the input of the converter. This voltage is converted to a frequency for the 80 milliseconds that switch M17A is closed. During time period 12, switch M20B is closed to put 0 volts into the converter. This 0 volts will be used to check the offset of the frequency to voltage conversion in the uphole circuitry. During time period 14, switch M17B is closed which puts the voltage Vres to the converter for 80 milliseconds.

M25A is a differential line driver that sends the pulse train generated by the voltage to frequency converter M19 in a differential form up the hole to the panel as signals +FOUT and −FOUT. This differential driving of the pulses along with the conversion to a frequency insures that the signal will not be affected by stray electrical or magnetic fields caused by the pulsing of the power supply, power line noise, etc.

Figure 5A:
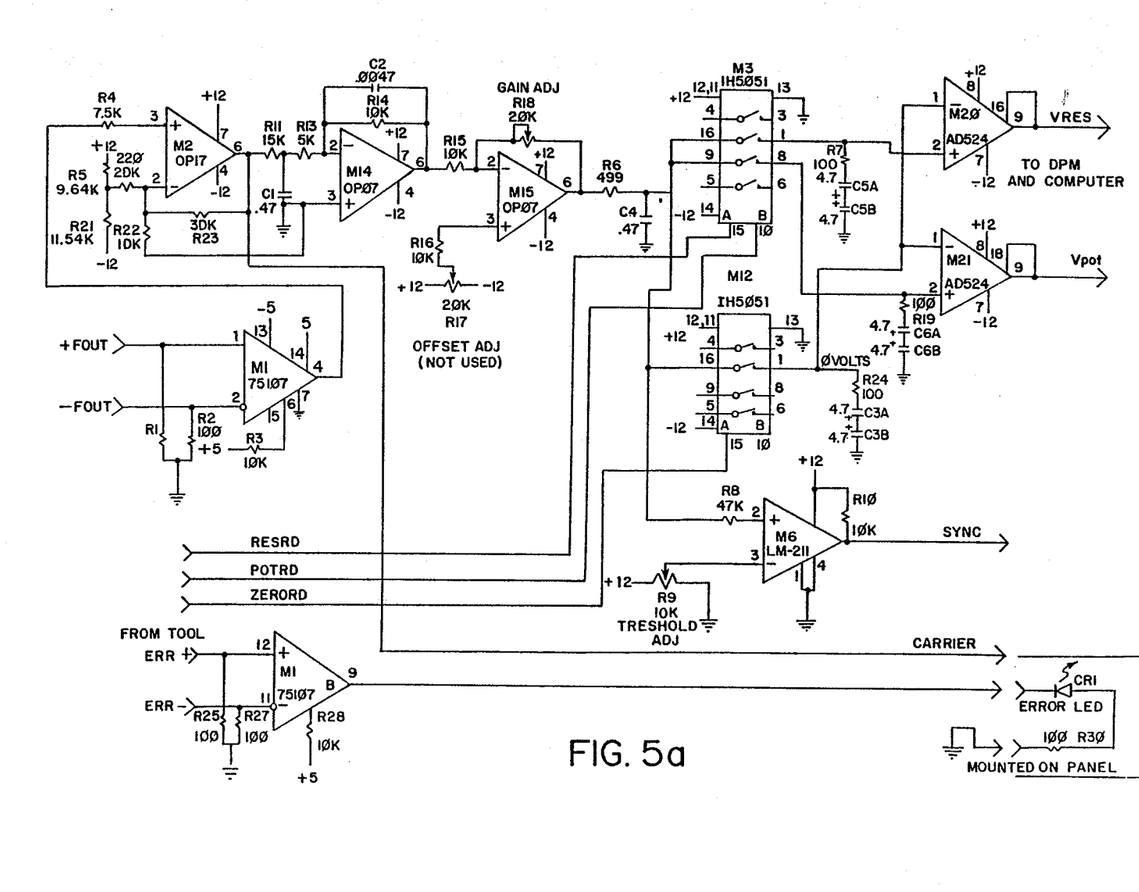
FIGS. 5a and 5b show a circuit diagram for the decoder.
Figure 5B:
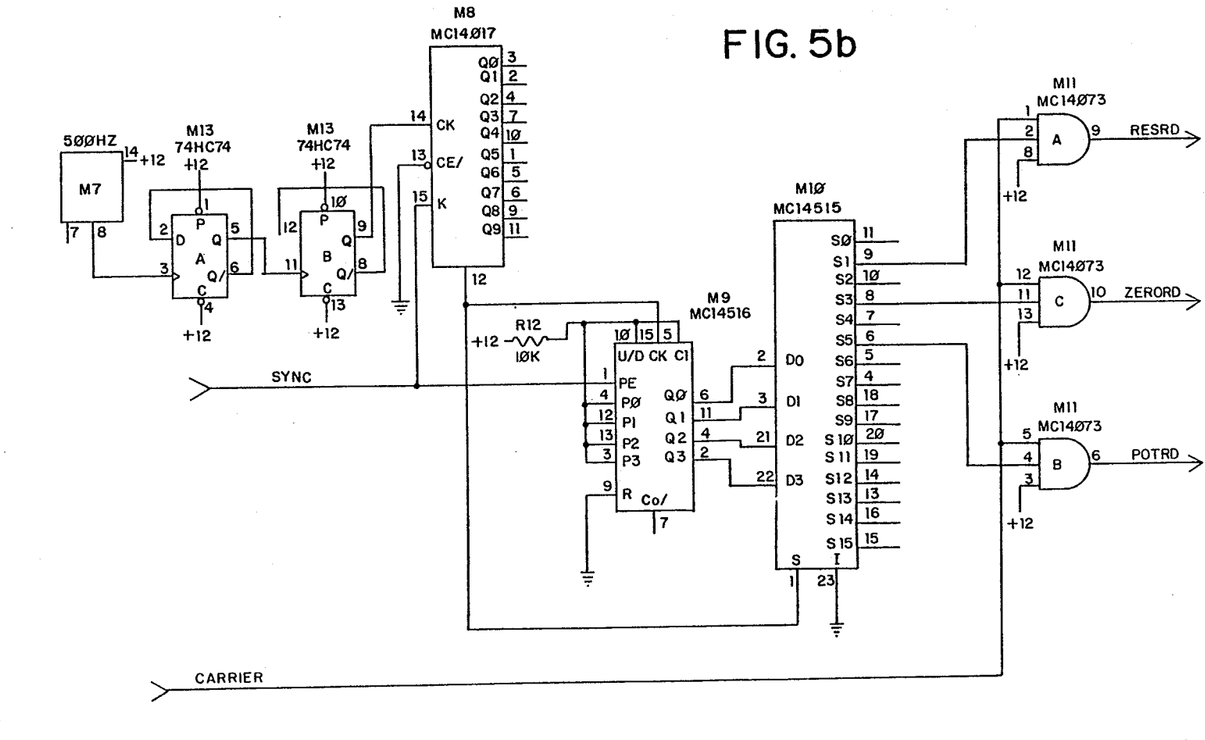

The casing resistance tool encodes and differentially transmits its data and, therefore, requires supporting circuitry to decode the data. This equipment is illustrated in FIGS. 5a and 5b. The panel circuitry receives the differential pulses, converts them to a series of unipolar pulses, converts them back to analog voltages, samples these voltages, and makes them available to a computer and a front panel display.

M1, the differential line receiver, subtracts and amplifies the signals +FOUT and −FOUT to give a series of 5 volt pulses similar to what comes from the voltage to frequency converter in the tool. M2 then changes the 0 to 5 volt pulses to 0 to 12 volt pulses. This series of pulses is then converted to the decoded signal shown in FIG. 4 by M14 and M15.

The frequency to voltage converter has the pulses applied to C1 which charges to a voltage proportional to the duty cycle of the pulses. That is, the more pulses are applied to it, the higher the voltage that appears at R13. This voltage is then filtered by M14, C2, and R14. The resulting filtered voltage is then offset such that 0 volts into the voltage to frequency converter in the tool is 0 volts at M3-16. M15 amplifies the filtered voltage so that the voltages applied to the voltage to frequency converter are available at R6. The output of the frequency to voltage converter circuit is shown in FIG. 4 as the decoded signal.

The decoded signal has a sync pulse that is higher in magnitude than any expected data signal. M6 is a comparator to detect this sync pulse and use it to reset timing circuitry M7 through M11 and M13. This circuitry will then generate the pulses RESRD and POTRD and ZERORD to sample the decoded signal. This sampled voltage is stored in capacitors C5A and C5B, and C6A and C6B, and C3A and C3B.

The signal ZERORD closes switch M12A during time period 2 to sample what should be 0 volts. This 0 volts is stored in capacitors C3A and C3B. If the decoder is not adjusted so that there is no offset, this voltage will be something other than 0. This could affect both the CPP and the resistance readings. This voltage is subtracted from the voltages stored in capacitors C5A and C5B and C6A and C6B by amplifiers M20 and M21 to give an accurate reading free from any offset.

The casing resistance tool is supplied with power from the surface. Since a typical well logging cable can only transmit less than 1 ampere from the surface, the power required is kept to a minimum by the use of a bank of downhole capacitors (C5 to C8) which hold power until a large supply is required (see FIG. 6). In the preferred embodiment, this is a 5-amp current pulse. Higher currents would need to e provided for shorter contact spacings and could be provided by additional capacitors. The capacitors are kept charged by the small current from the surface.

Figure 6:
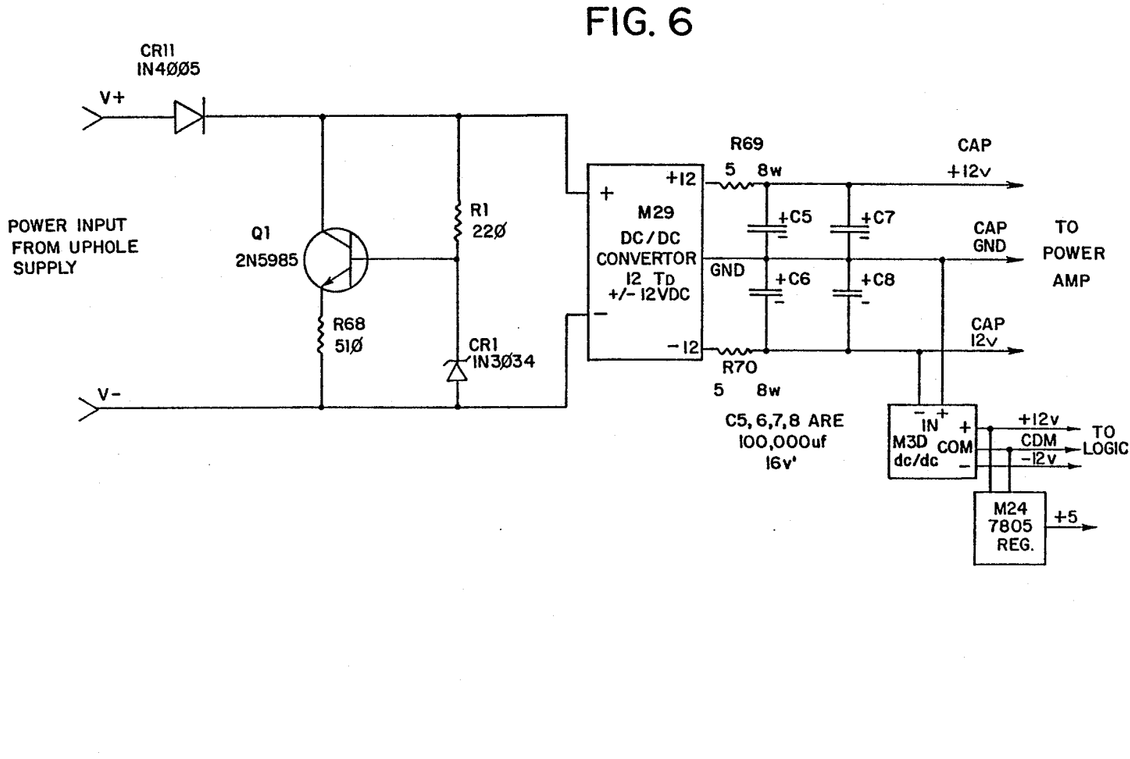
FIG. 6 illustrates the downhole power system.

The circuit formed by CR11, Q1, R68, R1, and CR1 is a preregulator to keep the voltage applied to DC/DC converter M29 within its input voltage specifications. This converter changes the power from the uphole supply to regulated voltages for the current injection circuitry.

This voltage is used to charge the capacitors C5–C8 through R69 and R70. The power from the capacitors supplies the power amplifier M14. The regulated voltage from M29 also supplies a DC/DC converter (M30) which powers the logic and analog circuits in the tool.

It should be noted that while the preferred embodiment has been described with capacitors used to provide enhanced current through the well casing, other means could also be provided. For example, a downhole battery or several batteries could be used to provide the enhanced current necessary to make accurate readings.

While the invention has been described above with a great deal of particularity, it is to be understood that the above embodiments are intended to be illustrative and not restrictive. For example, the tool could be used to inspect pipelines, drill pipes, well conductors, or other tubular products. The scope of the invention should, therefore, be determined with reference to the appended claims along with the full range of equivalents to which they are entitled.

What is claimed is:

1. Apparatus for determining resistance in a tubular metallic member comprising:
   (a) a central body adapted to be inserted in said tubular metallic member;
   (b) first and second contacts extending from said central body and adapted to contact the tubular metallic member;
   (c) means for generating a current in the tubular metallic member between said first and said second contacts further comprising:
      (i) means for supplying a current to said body; and
      (ii) capacitance means operably connected to said means for supplying a current, said capacitance means capable of providing current to said tubular metallic member between said first and second contacts said current to said tubular metallic member substantially greater than said current to said body;
   (d) means for measuring a potential difference between said first and said second contacts; and
   (e) means for calculating resistance based on said current and said potential difference.

2. Apparatus as recited in claim 1 further comprising means for determining a natural potential difference between said first and second contacts.

3. Apparatus as recited in claim 1 further comprising means for providing a constant current flow from said capacitance means.

4. Apparatus as recited in claim 3 wherein said constant current flow is substantially a 5-ampere current.

5. Apparatus as recited in claim 3 further comprising means for delaying said means for measuring potential difference until a steady state value can be measured.

6. Apparatus as recited in claim 5 wherein said means for delaying is an 8-millisecond means for delaying.

7. Apparatus as recited in claim 3 further comprising:
   (a) means for applying a constant negative current flow from said capacitors to said contacts; and
   (b) means for subtracting a voltage resulting from said constant current flow from a voltage resulting from said constant negative current flow.

8. Apparatus as recited in claim 1 further comprising means for checking a connection of said contacts.

9. Apparatus as recited in claim 8 wherein said means for checking a connection of said contacts is a means for supplying a pulse to said contacts.

10. Apparatus as recited in claim 1 wherein said means for generating a current to said tubular metallic member is a set of outer contacts and further comprising means for checking a connection of said outer contacts.

11. Apparatus as recited in claim 10 wherein said means for checking a connection is a means for determining a voltage drop.

12. Apparatus as recited in claim 1 further comprising:
   (a) means for transmitting said potential difference through a logging cable as a pulse train; and
   (b) means for decoding said pulse train in surface measuring equipment.

13. Apparatus as recited in claim 12 further comprising means for adjusting said means for decoding for offset.

14. Apparatus as recited in claim 1 further comprising means for separating current pulses to permit charges, currents, and magnetic effects to decay.

15. Apparatus as recited in claim 1, 2, 3, 4, 5, 6, 7, 8, 9, 10, 11, 12, 13, or 14 wherein said tubular metallic member is a subterranean well casing.

16. Apparatus as recited in claim 1 wherein said body is constructed of a nonmagnetic material.

17. A method of determining resistance in a tubular metallic member comprising the steps of:
   (a) supplying a current to a body inserted into said tubular metallic member:
   (b) providing a substantially increased current to first and second contacts extending from said body with capacitance means;
   (c) supplying said increased current to said tubular metallic member with said first and second contacts;
   (d) measuring a potential difference between said first and second contacts; and
   (e) calculating resistance in said tubular metallic member based on said potential difference and said current.

18. The method as recited in claim 17 further comprising the step of determining a natural potential difference between said first and second contacts.

19. The method as recited in claim 17 further comprising the step of regulating said increased current to be a substantially constant increased current.

20. The method as recited in claim 19 wherein said substantially constant increased current is a substantially 5-ampere current.

21. The method as recited in claim 17 wherein the step of measuring said potential difference is delayed to allow a steady state value to be measured.

22. The method as recited in claim 21 wherein said delay is an 8-millisecond delay.

23. The method as recited in claim 19 further comprising the steps of:
   (a) applying a substantially constant negative increased current to said contacts; and
   (b) subtracting a negative potential resulting from said substantially constant negative increased current from said potential difference.

24. The method as recited in claim 17 further comprising the step of checking a connection of said contacts.

25. The method as recited in claim 24 wherein said step of checking the connection of said contacts is the step of providing a pulse to said contacts.

26. The method as recited in claim 17 further comprising the steps of transmitting data from the body as a pulse train and decoding said pulse train in surface measuring equipment.

27. The method as recited in claim 26 further comprising the step of adjusting for offset.

28. The method as recited in claim 17 further comprising the steps of:
(a) providing a plurality of increased current pulses to said tubular metallic member; and
(b) delaying said current pulses to permit charges, currents, and magnetic effects to substantially decay.

29. The method as recited in claim 17, 18, 19, 20, 21, 22, 23, 24, 25, 26, 27, or 28 wherein said tubular metallic member is a well casing.

* * * * *